(12) United States Patent
Duval et al.

(10) Patent No.: US 10,418,339 B2
(45) Date of Patent: Sep. 17, 2019

(54) 3D PACKAGING METHOD FOR SEMICONDUCTOR COMPONENTS

(71) Applicant: IMEC VZW, Leuven (BE)

(72) Inventors: Fabrice Duval, Heverlee (BE); Fumihiro Inoue, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/020,702

(22) Filed: Jun. 27, 2018

(65) Prior Publication Data

US 2019/0006301 A1 Jan. 3, 2019

(30) Foreign Application Priority Data

Jun. 28, 2017 (EP) ..................................... 17178490

(51) Int. Cl.
*H01L 21/00* (2006.01)
*H01L 23/00* (2006.01)
(Continued)

(52) U.S. Cl.
CPC ............ *H01L 24/11* (2013.01); *H01L 21/561* (2013.01); *H01L 21/563* (2013.01); *H01L 21/76828* (2013.01); *H01L 24/16* (2013.01); *H01L 24/27* (2013.01); *H01L 24/29* (2013.01); *H01L 24/73* (2013.01); *H01L 24/81* (2013.01);
(Continued)

(58) Field of Classification Search
CPC ......... H01L 21/76828; H01L 21/02255; H01L 21/02318; H01L 51/0018
See application file for complete search history.

(56) References Cited

U.S. PATENT DOCUMENTS 6,773,958 B1 8/2004 Wang
9,355,906 B2 * 5/2016 Chen ..................... H01L 21/78
(Continued)

FOREIGN PATENT DOCUMENTS

JP 2003-258023 A 9/2003
JP 2015-34986 A 2/2015
JP 2016-114623 A 6/2016

OTHER PUBLICATIONS

Mitsukura, Kazuyuki et al., "Development and Evaluation of Photodefinable Wafer Level Underfill", Journal of Photopolymer Science and Technology, vol. 28, No. 2, 2015, 4 pages.
(Continued)

*Primary Examiner* — Nicholas J Tobergte
(74) *Attorney, Agent, or Firm* — McDonnell Boehnen Hulbert & Berghoff LLP

(57) ABSTRACT

The present disclosure relates to a method for bonding semiconductor components. A semiconductor component comprising microbumps on a planar bonding surface is prepared for bonding by applying a photosensitive polymer layer on the bonding surface. The average thickness of the initial polymer layer in between the microbumps is similar to the average height of the microbumps. In a lithography process, the polymer is removed from the upper surface of the microbumps and from areas around the microbumps. The polymer is heated to a temperature at which the polymer flows, resulting in a polymer layer that closely adjoins the microbumps, without exceeding the microbump height. The closely adjoining polymer layer may have a degree of planarity substantially similar to a planarized layer.

15 Claims, 3 Drawing Sheets

(51) Int. Cl.
*H01L 21/768* (2006.01)
*H01L 21/56* (2006.01)

(52) U.S. Cl.
CPC .............. *H01L 24/92* (2013.01); *H01L 24/13* (2013.01); *H01L 24/83* (2013.01); *H01L 2224/11019* (2013.01); *H01L 2224/11822* (2013.01); *H01L 2224/13005* (2013.01); *H01L 2224/13083* (2013.01); *H01L 2224/13111* (2013.01); *H01L 2224/13147* (2013.01); *H01L 2224/13155* (2013.01); *H01L 2224/16145* (2013.01); *H01L 2224/279* (2013.01); *H01L 2224/27416* (2013.01); *H01L 2224/27422* (2013.01); *H01L 2224/27436* (2013.01); *H01L 2224/27618* (2013.01); *H01L 2224/27622* (2013.01); *H01L 2224/27849* (2013.01); *H01L 2224/29011* (2013.01); *H01L 2224/29012* (2013.01); *H01L 2224/2919* (2013.01); *H01L 2224/73103* (2013.01); *H01L 2224/73104* (2013.01); *H01L 2224/73204* (2013.01); *H01L 2224/81191* (2013.01); *H01L 2224/81203* (2013.01); *H01L 2224/81815* (2013.01); *H01L 2224/81948* (2013.01); *H01L 2224/83191* (2013.01); *H01L 2224/83203* (2013.01); *H01L 2224/83856* (2013.01); *H01L 2224/83862* (2013.01); *H01L 2224/83948* (2013.01); *H01L 2224/9211* (2013.01); *H01L 2224/94* (2013.01)

(56) References Cited

U.S. PATENT DOCUMENTS

| | | | |
|---|---|---|---|
| 9,923,013 B1* | 3/2018 | Yamashita | H01L 27/14643 |
| 10,134,699 B2* | 11/2018 | Hu | H01L 24/13 |
| 2002/0162679 A1 | 11/2002 | Hannan et al. | |
| 2004/0113246 A1 | 6/2004 | Boon | |
| 2006/0038291 A1* | 2/2006 | Chung | H01L 23/3114 |
| | | | 257/738 |
| 2009/0179327 A1 | 7/2009 | Huang et al. | |
| 2012/0178218 A1 | 7/2012 | Bauer et al. | |
| 2012/0181686 A1 | 7/2012 | Park et al. | |
| 2013/0299986 A1 | 11/2013 | Sun et al. | |

OTHER PUBLICATIONS

De Preter, Inge et al., "Surface Planarization of Cu and CuNiSn Micro-Bumps Embedded in Polymer for Below 20um Pitch 3DIC Applications", 32nd Advanced Metallization Conference, 2015, 4 pages.

Mitsukura, Kazuyuki et al., "Packaging Material Evaluation for 2.5D/3D TSV Application", Transactions of the Japanese Institute of Electronic Packaging, 2016, E16-011, pp. 1-7.

European Search Report, European Patent Application No. 17178490.3, dated Jan. 5, 2018, 10 pages.

* cited by examiner

3D PACKAGING METHOD FOR SEMICONDUCTOR COMPONENTS

CROSS-REFERENCE TO RELATED APPLICATION

The present application is a non-provisional patent application claiming priority to European Patent Application No. 17178490.3 filed Jun. 28, 2017, the contents of which are hereby incorporated by reference.

TECHNICAL FIELD

The present disclosure is related to 3D-packaging of semiconductor components, including the bonding of integrated circuit chips to form a stack of chips, or the bonding of a chip to a semiconductor wafer, or the bonding of a wafer to another wafer.

BACKGROUND

The bonding of two semiconductor components involves the accurate alignment of the components and the formation of electrical connections between multiple contacts on each of the components. These contacts are formed as metal areas embedded in a layer of dielectric, such as copper contact pads formed in oxide, and produced by a damascene-type process. In thermocompression bonding, contact bumps, such as microbumps formed of solder or formed of stacks of various materials (e.g. Cu/Ni/Sn), are produced on the Cu-contact pads prior to bonding, on one or both of the components that are to be bonded. In applications such as memory chips, dense arrays of contacts are to be interconnected, with the pitch of these arrays being of the order of 20 µm in present day technology. This can require a dense array of microbumps with a height and diameter of the order of 5-10 µm for example. One way of reducing the microbump pitch is to use embedded microbumps, e.g., embedding the microbumps in a planar layer of embedding material so that planar bonding surfaces are obtained. The embedding layer can enable a better alignment tolerance and a better control of the microbump height variation and of the microbump roughness. In addition, the microbumps are protected during process steps and manipulations of the components before the bonding step.

In some examples, a polymer can be used as the above-described embedding material for microbumps. "Surface planarization of Cu and CuNiSn Micro-bumps embedded in polymer for below 20 µm pitch 3DIC applications", De Preter et al., 32nd Advanced Metallization Conference, 2015, describes the planarization of a polymer layer applied on an array of solder microbumps, by chemical mechanical polishing (CMP) or by a surface planer (so-called fly-cut technique). CMP and fly-cut are, however, expensive process steps that are not always available. CMP in particular may need to be optimized for each polymer type. For some polymers, it may be difficult or impossible to find a suitable CMP recipe.

In U.S. Patent Publication No. US2013/0299986, a method is proposed in which a layer of photopatternable polymer is applied on an array of solder bumps of a semiconductor die, and then selectively removed from the upper surface of the bumps by a lithography and etch process. The die is then bonded to another die by a thermocompression process, during which the polymer reflows and fills the complete area between the bonded dies and around the bumps. Bonding can be applied on wafer level, e.g., wafers comprising multiple dies are processed and bonded as described above. One drawback of this approach is that the polymer material together with the upper surface of the bumps may not form a uniform surface after the lithography and etch step. Especially when the bumps have a semi-spherical upper surface as shown in the drawings of US2013/0299986, the polymer layer does not closely adjoin the circumference of the bumps after lithography and etch, leaving an irregular upper surface of the die. Also, neither a uniform thickness of the polymer layer nor a uniform bump height across the full surface of a wafer comprising multiple dies can be guaranteed. Such non-uniformities may cause unwanted contamination of some of the bumps during the thermocompression step which can take place in a matter of seconds. Especially when important non-uniformities occur, this short timespan may be insufficient for the polymer to be distributed evenly between and around the bumps.

SUMMARY OF THE DISCLOSURE

Disclosed herein are methods that can help address the above described drawbacks. Some embodiments disclose a method for preparing a semiconductor component for a thermal bonding process. The component may, for example, be an integrated circuit chip or a wafer comprising multiple chips, comprising a bonding surface and an array of microbumps. Some embodiments disclose a bonding method for thermal bonding of the prepared component to another component. In some embodiments, a photosensitive polymer layer is produced on the bonding surface and on the microbumps, for example by spin-coating a solution comprising the polymer followed by a soft bake for removing volatile components to obtain a dry and non-cured initial polymer layer. In some embodiments, this initial polymer layer is produced in a thickness in between the microbumps that is similar to the average height of the microbumps. This is followed by a lithography-step wherein the polymer is patterned and at least partially removed from areas adjacent the microbumps. In some embodiments, the polymer on top of the microbumps is completely removed by the lithography step. This is followed by heating the polymer layer to a temperature at which the polymer flows, resulting in a polymer layer that closely adjoins the microbumps, while not exceeding the microbump height.

In some embodiments, the closely adjoining polymer layer has a sufficient degree of planarity to make it equivalent or substantially equivalent to a planarized layer obtainable by methods as described above. In other words, the result after bonding can be essentially the same as in the case of methods that apply a planarization step. One advantage of the methods disclosed herein is that no planarization by CMP or by fly-cut is required, which can make the methods less expensive and more universally applicable. Also, compared to the method of US2013/0299986, the methods disclosed herein can be advantageous. The at least partial removal of the polymer around the microbumps, together with the reflow step performed prior to bonding, can ensure that the reflowed polymer closely adjoins the microbumps prior to bonding, so that a uniform surface of the polymer layer is obtained, without any polymer on top of the bumps, and regardless of non-uniformities in the bump height. As the reflow step precedes the thermocompression step, the reflow is not confined to the short time span of the latter thermocompression, so that the polymer may be accorded sufficient time to be distributed evenly between the bumps. In some embodiments, the reflow heating performed before bonding is applied during a time span of 1 to 10 minutes. In some embodiments, the thermocompression bonding takes place in a matter of seconds.

The present disclosure is thus related to a method for preparing a semiconductor component for a thermal bonding process, the component having a planar bonding surface and an array of microbumps on the bonding surface. In some examples, the method involves producing a polymer underfill layer on the bonding surface, where the polymer is a photo-patternable polymer, and where an initial polymer layer is produced on the bonding surface and on the microbumps, the polymer layer having an average thickness in between the microbumps that is similar to the average microbump height. As used herein, the term "similar to the average bump height" means that the difference (higher or lower) of the average layer thickness between the microbumps with respect to the average microbump height is less than 10%, less than 5%, or less than 2%. The method may further involve subjecting the initial polymer layer to a lithography step, wherein the polymer is patterned and removed completely from the upper surface of the microbumps and at least partially from areas adjacent the microbumps. After the lithography step, the polymer layer is heated to a temperature at which the polymer flows, to thereby form a reflowed polymer layer that directly adjoins the sidewalls of the microbumps without exceeding the height of the microbumps.

In some embodiments, at least a number of areas are formed around the full circumference of individual microbumps according to the process described above. One or more of the areas may be common to two adjacent microbumps.

In some embodiments, the polymer is applied by spin-coating or dip coating of a liquid solution comprising the polymer onto the bonding surface, followed by a heating step at a temperature sufficient to remove volatile components from the solution, to thereby produce the initial polymer layer. Alternatively, the polymer may be applied by a lamination technique. The polymer may be a BCB-based polymer.

In some embodiments, the initial polymer layer is a dry, non-cured polymer layer. The reflowed polymer layer may be partially cured after cooling down from the temperature at which the reflow step takes place.

In some embodiments, the viscosity of the polymer is between 100 and 10,000,000 mPa·s at 200° C., or between 100 and 100,000 mPa·s at 200° C., or between 100 and 10,000 mPa·s at 200° C.

The present disclosure is further related to a method for bonding two semiconductor components having planar bonding surfaces, at least one component comprising on its bonding surface an array of microbumps which are to be bonded (i) to a corresponding array of microbumps on the bonding surface of the other component, or (ii) to a corresponding array of contact pads on the bonding surface of the other component. The method involves the step of thermally bonding the components, in which the above-described method for preparing a component is applied to prepare the component or components that comprise microbumps before the bonding step is applied. The bonding step may be a thermocompression bonding step. The bonding step may be followed by a post-bond anneal.

DETAILED DESCRIPTION

Figure 1A:
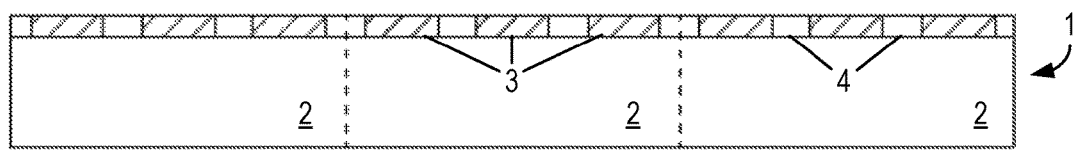
FIG. 1a illustrates a semiconductor device, according to an example embodiment.
Figure 1B:
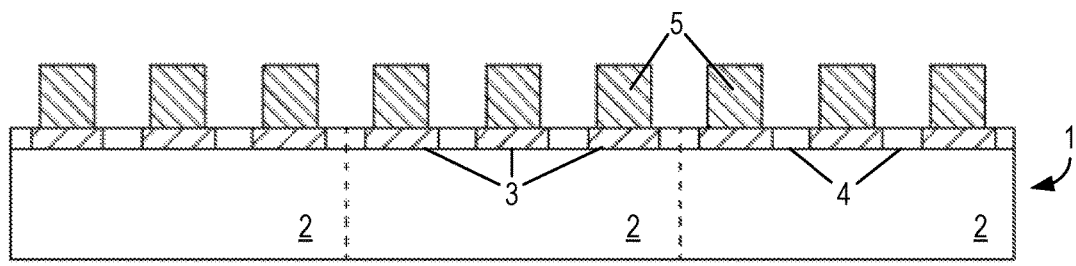
FIG. 1b illustrates the semiconductor device of FIG. 1a after forming a plurality of microbumps on the device, according to an example embodiment.

In the context of the present disclosure, the following definitions are applicable. A "non-cured polymer layer" is a dry and soft polymer layer, meaning that it is elastically deformable by a low force, for example, by pressing the layer with a finger. This is a condition that may be obtained when a solution of a polymer is heated to a drying temperature sufficient to remove volatile components from the solution, e.g., the solvent or solvents and possible volatile additives. A "partially cured polymer" is a polymer that has obtained an increased mechanical resistance which may be obtained, for example, by heating to a higher temperature than the drying temperature, however not yet to the degree that the polymer has fully solidified. A "fully cured polymer" is a layer that has reached a predefined high level in terms of mechanical resistance or hardness, for example, obtainable by a baking step.

FIGS. 1a to 1h illustrate the steps of one embodiment of a method for bonding two semiconductor components. The description thus includes a detailed account of embodiments of a method for preparing a component and of a method for bonding the thus prepared component. A semiconductor wafer 1 is provided, comprising a plurality of chips 2, produced on adjacent areas of the wafer, by a semiconductor fabrication process known in the art and not described here in detail. The wafer 1 has a planar top layer comprising metal contact pads 3 embedded in a dielectric material 4, which is obtainable by a damascene type process, for example. Each chip 2 comprises a number of these contact pads 3. For illustrative purposes, the chips are not drawn to a realistic scale. For example, the number of contacts 3 may be much higher in relation to the chip dimensions, which may be of the order of a few millimeters. As stated above, a realistic pitch of the contact array may be about 20 μm, meaning that thousands of contact pads 3 may be present on a single chip 2.

A plurality of microbumps 5 is then produced on the wafer 1 (FIG. 1b), each microbump being formed in electrical contact with a metal contact pad 3. The formation of microbumps can be done by electroplating, as known in the art and not explained here in detail. The microbumps 5 may consist of a stack of various metal and/or solder materials, e.g., a stack of 5 μm Cu, 1 μm Ni and 3.5 μm Sn. The microbumps 5 may have a circular cross-section, with a diameter between 5 and 10 μm, for example. This wafer 1 provided with the microbumps 5 is the starting point of the methods disclosed herein.

In accordance with the present disclosure, a layer 6 of a photopatternable polymer is then produced on the wafer surface. The polymer may be applied by spin-coating a solution comprising a solvent and the polymer onto the surface of the wafer 1. The liquid layer covers the wafer surface and the upper surface of the microbumps 5. The liquid layer is then subjected to a soft baking process, at a temperature sufficient to remove the volatile components from the applied solution, leaving a layer 6 of dry, non-cured polymer, as defined above, in between the microbumps 5, and a thin polymer layer 6' on top of the microbumps 5. The soft-baking temperature is lower than the minimum reflow temperature needed for reflow of the dry layer 6 (see further). In some embodiments, the average thickness of the layer 6 in between the microbumps 5 is similar to the average microbump height. For instance, the difference (higher or lower) of the average layer thickness between the microbumps 5 with respect to the average microbump height may be less than 10%, less than 5%, or less than 2%. The word "average" in "average thickness of the layer 6" refers to the fact that the layer 6 may not have a flat upper surface, but rather this surface may be curved. The word "average" in "average microbump height" refers to a possible degree of non-uniformity of the microbump height. The non-uniformity can be up to 10% of the as-designed microbump height, and it can be further reduced or minimized by adequately tuning the electroplating process. To obtain a layer of non-cured polymer 6 between the microbumps 5 of an average thickness similar to the average height of the microbumps 5 after solvent removal, the spin-coating process may be adequately tuned in terms of the rotational speed of the wafer during the spin-coating. This may be achieved by performing a limited number of trials wherein the non-cured polymer layer thickness is measured after each trial.

Figure 1C:
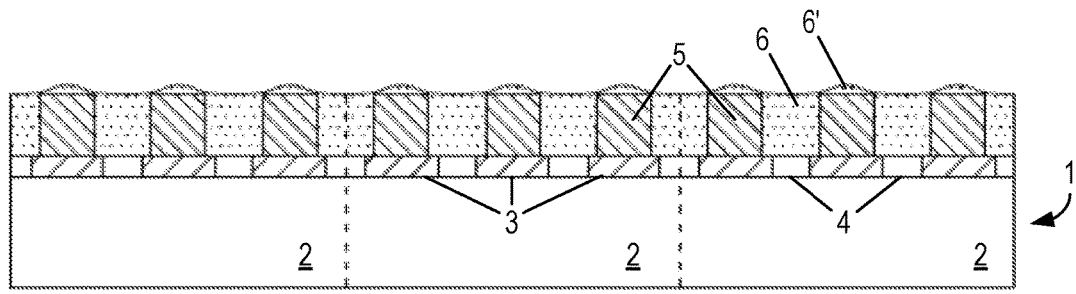
FIG. 1c illustrates the semiconductor device of FIG. 1b after forming a polymer layer on the device, according to an example embodiment.

Alternative ways of applying the polymer include dip coating (dipping the substrate into a bath containing a polymer solution, followed again by a soft bake for removing the volatile components) or dry coating (laminating a film of the polymer onto the substrate, possibly under vacuum conditions). Here again, a limited number of trials for tuning these alternative methods will allow for producing a polymer layer 6 in between the microbumps 5, having an average thickness similar to the average microbump height, as illustrated in FIG. 1c.

Figure 1D:
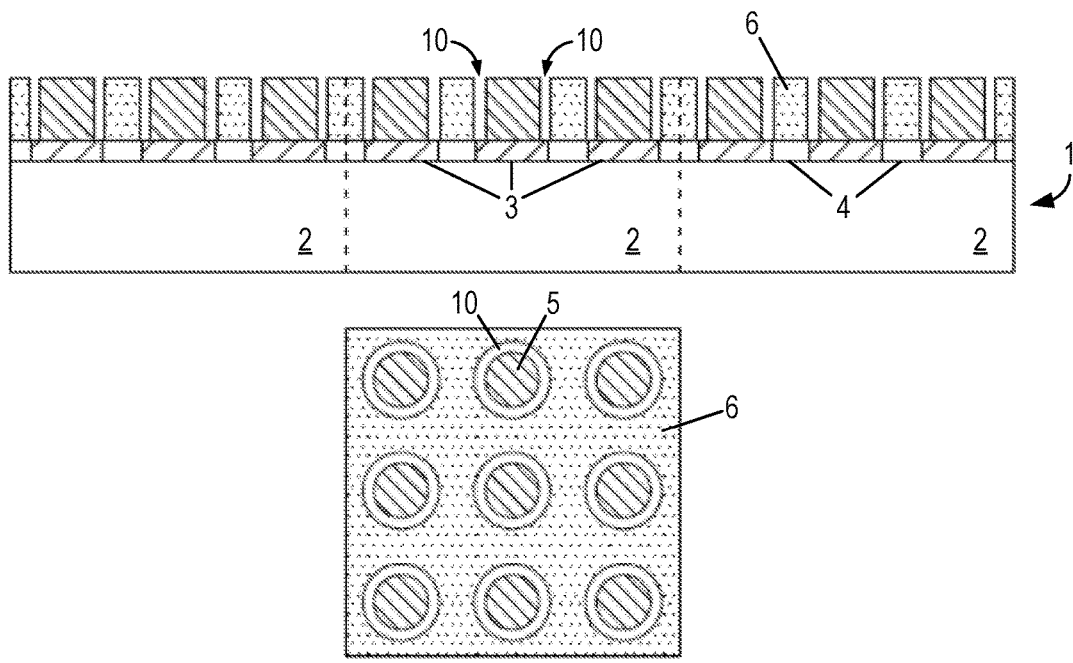
FIG. 1d illustrates the semiconductor device of FIG. 1c after subjecting the device to a lithography process, according to an example embodiment.
Figure 1E:
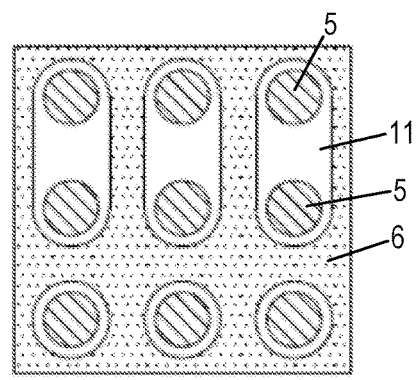
FIG. 1e illustrates the semiconductor device of FIG. 1c after subjecting the device to a lithography process different than the device of FIG. 1d, according to an example embodiment.

As seen in FIG. 1d, the photopatternable polymer layer 6 is then subjected to a lithography process, configured to at least partially remove the polymer from an area surrounding each of the microbumps 5 and adjacent to the microbumps' sidewalls. This may be a ring-shaped area 10 around each microbump, as shown in FIG. 1d, which includes a top view of one of the chips 2 at this stage of the process. Alternatively or in combination with such ring-shaped areas 10, as seen in the alternative top view shown in FIG. 1e, the polymer may be removed in one or more areas 11 that surround two adjacent microbumps 5. All the polymer material that is present on the upper surface of the microbumps 5 may be removed in the lithography step. In other words, after the lithography-step, all the microbumps 5 may have polymer-free upper surfaces, as well as an area 10 or 11 directly surrounding the microbumps 5 where the polymer is at least partially removed. "At least partially" means that the polymer removal may either be performed over the full thickness of the polymer, exposing the bonding surface in the areas 10 or 11, or only partially, leaving a layer of polymer on the bonding surface in the areas 10 or 11. Also, the areas 10 or 11 may be adjacent to only a part of some of the sidewalls of the microbumps 5, instead of fully surrounding the microbumps 5. For example, the areas where the full or partial thickness of the polymer is removed may form arc-shaped portions around the microbumps 5.

The lithography can be performed by using existing and well-known tools, and a suitable photomask can be designed in accordance with the shape of the areas 10 and/or 11. Due to the fact that the polymer is photopatternable, the polymer layer 6 acts as a resist layer in the lithography process. The masks can be designed so that polymer material is patterned to fixate the exposed or non-exposed material (depending on whether the polymer has positive or negative tone polarity) between the microbumps 5 and subsequently removed from the areas 10 and/or 11 and from the upper surface of the microbumps 5 by stripping the non-fixated material.

Figure 1F:
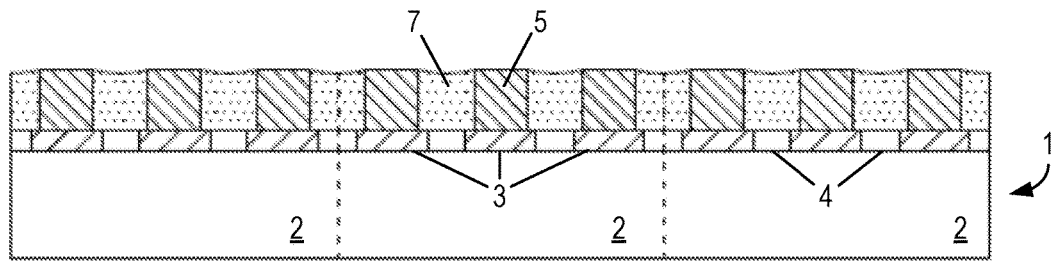
FIG. 1f illustrates the semiconductor device of FIG. 1d or 1e after heating the device, according to an example embodiment.

The next step is a heating step at a higher temperature than the soft bake, but the heating temperature may be lower than the temperature at which the actual bonding, possibly by thermocompression, will be performed. At this higher temperature, the viscosity of the polymer is such that a reflow of the polymer takes place, i.e., the polymer flows into the areas 10 and/or 11 around the microbumps 5. After cooling down from the higher temperature, this results in the microbumps 5 being embedded in a polymer layer 7 (FIG. 1f) that closely adjoins the microbumps 5 without exceeding the height of the microbumps 5, e.g., a layer that fully surrounds each microbump 5, being in direct contact with the microbumps 5 up to or close to the full microbump height, and with no polymer being present on top of the microbumps 5. The reflowed polymer layer 7 can be partially cured at this stage, in the sense as defined above. Due to the previous removal of polymer material around the microbumps 5, the average level of the reflowed polymer layer 7 is slightly lower than the average microbump height 5. Due to the surface tension of the flowable polymer, the polymer may attach to the upper rim of the microbumps 5, while falling to a lower depth away from the microbumps 5, as shown in FIG. 1f.

Figure 1G:
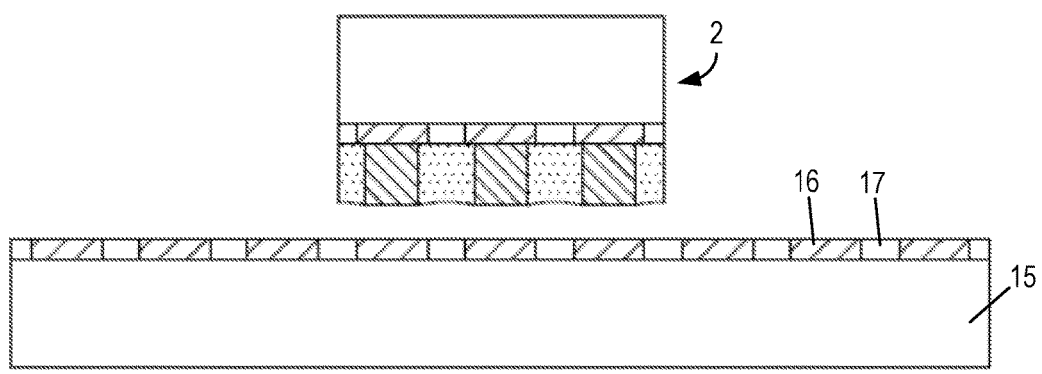
FIG. 1g illustrates a segmented portion of the semiconductor device of FIG. 1f before bonding the segmented portion to another semiconductor device, according to an example embodiment.
Figure 1H:
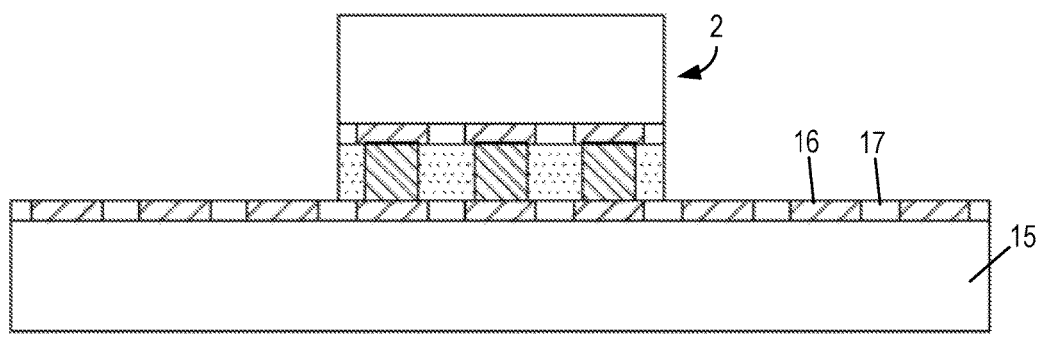
FIG. 1h illustrates the segmented portion of the semiconductor device of FIG. 1f after bonding the segmented portion to another semiconductor device, according to an example embodiment.

The wafer 1 may then be diced to form separate chips 2, as illustrated in FIG. 1g. These separate chips may be bonded to another chip or to a larger wafer. The latter example is illustrated in FIG. 1h, showing the alignment of one chip 2 to a carrier wafer 15 provided with matching contact pads 16 embedded in a dielectric 17 and configured to receive the microbumps 5 of the chip 2 thereon. The bond may be established by thermal bonding, i.e., bringing the microbumps 5 and/or contact areas 16 into contact at an elevated bonding temperature. Alternatively, in some embodiments, a thermocompression step is applied by compressing the stack of the chip 2 and the carrier wafer 15, at a constant bonding temperature, or by ramping the temperature up to a given value and down again, during a given timespan. Details of such bonding methods are well-known and therefore not described here. The thermal bonding or thermocompression bonding may be followed by a post-bond anneal. The bonding and post-bond anneal temperatures can be configured so that the polymer forms a fully cured underfill layer around the microbumps 5. When thermocompression is applied, a lower average level of the reflowed polymer layer 7 in the areas between the microbumps 5 may not hinder the adequate formation of an underfill layer after bonding. Rather, the microbumps 5 are compressed to a certain degree during thermocompression bonding, so that the lower polymer volume between the microbumps 5 is still able to fill up the area between the microbumps 5 after bonding.

The dimensions of the areas 10 or 11 may depend on the microbump dimensions and the pitch of the microbump array. The dimensions may be chosen such that the reflowed polymer layer 7 is sufficiently thick so as to be equivalent or substantially equivalent to a planarized layer formed by CMP, for example.

An example of a polymer that is suitable for use in connection with the present disclosure is a photosensitive polymer, such as a photosensitive polymer with a negative tone polarity. BCB (benzo cyclobutene)-based photosensitive polymers and polymers of this type which also comply with a number of the requirements described hereafter, are suitable for use in connection with the present disclosure. In some embodiments, a suitable polymer is applicable by at least one of the above-described methods, e.g., spin coating, dip coating or dry coating, to obtain a non-cured layer at or near the average level of the microbumps. In some embodiments, when a soft baking step is applied, this step may be applied at temperatures and during time-intervals which are appropriate for photosensitive polymer materials, for example at a temperature between 50° C. and 170° C., for a few minutes, e.g., between 1 and 10 minutes. The viscosity of the polymer at the temperature applied during the reflow step is such that the reflow is capable of taking place, so that the reflowed layer 7 is formed adjoining the microbumps 5. In some embodiments, the polymeric material has a viscosity between 100 and 10,000,000 mPa·s at 200° C., between 100 and 100,000 mPa·s at 200° C., or between 100 and 10,000 mPa·s at 200° C. In some embodiments, the reflow step is performed at a temperature between 130° C. and 210° C. or between 130° C. and 170° C., during a time interval sufficient to allow the reflow to take place, which may be, for example, between 1 and 10 minutes. In some embodiments, the layer is partially cured after the reflow step. The polymer material is further configured to become fully cured after bonding and, if applicable, post-bond annealing, performed at temperatures which are appropriate for thermocompression bonding. For example, bonding may take place by applying pressure to the components while the temperature is ramped up and down to and from about 250° C. during a time period of approximately 10 seconds, followed by a post-bond anneal at a temperature between 150° C. and 200° C. for about 60 minutes.

The present disclosure is not limited to the embodiments illustrated in the drawings. The methods disclosed herein are applicable to the bonding of a chip to another chip, or to the bonding of a wafer to another wafer. Microbumps may be present on both surfaces which are to be bonded. In that case, a photopatternable polymer layer can be produced, patterned and subjected to a reflow on both surfaces prior to the bonding step.

While various embodiments have been illustrated and described in detail in the drawings and foregoing description, such illustration and description are to be considered illustrative and not restrictive. Other variations to the disclosed embodiments can be understood and effected from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used in practice.

What is claimed is:

1. A method for preparing a semiconductor component for a thermal bonding process, wherein the semiconductor component includes a planar bonding surface and an array of microbumps on the planar bonding surface, the method comprising:
    producing an initial polymer layer on the planar bonding surface and on the microbumps, wherein the initial polymer layer comprises a photo-patternable polymer, and wherein the initial polymer layer has an average thickness in between the microbumps that is substantially equivalent to an average height of the microbumps;
    performing lithography on the initial polymer layer, wherein the lithography comprises patterning the initial polymer layer, removing the initial polymer layer from an upper surface of the microbumps, and at least partially removing the initial polymer layer from areas adjacent to the microbumps; and
    after performing the lithography, heating the initial polymer layer to a temperature at which the photo-patternable polymer flows, thereby forming a reflowed polymer layer that directly adjoins sidewalls of the microbumps without exceeding the average height of the microbumps.

2. The method of claim 1, wherein at least partially removing the initial polymer layer from areas adjacent to the microbumps comprises removing the initial polymer layer around a full circumference of one or more of the microbumps.

3. The method of claim 1, wherein at least partially removing the initial polymer layer from areas adjacent to the microbumps comprises removing the initial polymer layer from an area that is common to two adjacent microbumps.

4. The method of claim 1, wherein producing the initial polymer layer comprises (i) spin-coating or dip coating a liquid solution comprising the photo-patternable polymer onto the planar bonding surface and (ii) heating the liquid solution at a temperature sufficient to remove volatile components from the liquid solution, thereby producing the initial polymer layer.

5. The method according of claim 1, wherein producing the initial polymer layer comprises applying the photo-patternable polymer using a lamination technique.

6. The method of claim 1, wherein producing the initial polymer layer comprises producing a dry, non-cured polymer layer.

7. The method of claim 1, further comprising at least partially curing the reflowed polymer layer by cooling down the reflowed polymer layer.

8. The method of claim 1, wherein a viscosity of the photo-patternable polymer at 200° C. is at least one of (i) between 100 and 10,000,000, (ii) between 100 and 100,000 mPa·s, or (iii) between 100 and 10,000 mPa·s.

9. The method of claim 1, wherein the photo-patternable polymer is a BCB-based polymer.

10. The method of claim 1, wherein heating the initial polymer layer to the temperature at which the photo-patternable polymer flows comprises heating the initial polymer layer for a duration of 1 to 10 minutes.

11. The method of claim 1, wherein the semiconductor component is a first semiconductor component, the method further comprising, after forming the reflowed polymer layer, thermally bonding the first semiconductor component to a second semiconductor component.

12. The method of claim 11, wherein thermally bonding the first semiconductor component to the second semiconductor component comprises using thermocompression to bond the first semiconductor component to the second semiconductor component.

13. The method of claim 11, further comprising, after bonding the first semiconductor component to the second semiconductor component, annealing the first and second semiconductor components.

14. The method of claim 11, wherein the second semiconductor component comprises an a bonding surface having an array of microbumps, and wherein thermally bonding the first semiconductor component to the second semiconductor component comprises thermally bonding the array of microbumps of the first semiconductor component to the array of microbumps of the second semiconductor component.

15. The method of claim 11, wherein the second semiconductor component comprises an a bonding surface having an array of contact pads, and wherein thermally bonding the first semiconductor component to the second semiconductor component comprises thermally bonding the array of microbumps of the first semiconductor component to the array of contact pads of the second semiconductor component.

* * * * *